United States Patent [19]

Garbarino et al.

[11] 4,251,571
[45] Feb. 17, 1981

[54] METHOD FOR FORMING SEMICONDUCTOR STRUCTURE WITH IMPROVED ISOLATION BETWEEN TWO LAYERS OF POLYCRYSTALLINE SILICON

[75] Inventors: Paul L. Garbarino, Ridgefield, Conn.; Stanley R. Makarewicz, New Windsor; Joseph F. Shepard, Hopewell Junction, both of N.Y.

[73] Assignee: International Business Machines Corporation, Armonk, N.Y.

[21] Appl. No.: 902,127

[22] Filed: May 2, 1978

[51] Int. Cl.³ .................................................. H01L 21/316
[52] U.S. Cl. .................................... 427/89; 29/571; 148/1.5; 148/187; 427/93; 427/255.4
[58] Field of Search ............ 427/93, 248 E, 399, 427/89; 29/571; 148/1.5, 187

[56] References Cited

U.S. PATENT DOCUMENTS

| | | | |
|---|---|---|---|
| 3,560,810 | 2/1971 | Balk | 427/93 |
| 3,825,442 | 7/1974 | Moore | 427/89 |
| 3,897,282 | 7/1975 | White | 427/93 |
| 3,913,126 | 10/1975 | Hooker | 148/175 |
| 3,939,293 | 2/1976 | Brusic | 148/6.3 |
| 4,075,045 | 2/1978 | Rideout | 427/93 |
| 4,086,614 | 4/1978 | Scheidel | 427/93 |
| 4,123,564 | 10/1978 | Ajima | 427/93 |

*Primary Examiner*—John D. Smith
*Attorney, Agent, or Firm*—Theodore E. Galanthay

[57] ABSTRACT

In a field effect device such as a charge coupled device or field effect transistor in which at least two levels of polycrystalline silicon conductors are used; these two levels of polycrystalline silicon are isolated from one another with a dielectric layer. Disclosed is a composite dielectric layer formed either by in situ oxidation of the first polycrystalline silicon layer plus chemical vapor deposited silicon dioxide or, in the alternative, the composite dielectric layer is formed by a phosphosilicate glass layer with thermal reoxidation of the first polycrystalline silicon layer.

7 Claims, 12 Drawing Figures

METHOD FOR FORMING SEMICONDUCTOR STRUCTURE WITH IMPROVED ISOLATION BETWEEN TWO LAYERS OF POLYCRYSTALLINE SILICON

DESCRIPTION

1. Technical Field

This invention relates to field effect circuit devices such as charge coupled devices and field effect transistors, and more particularly to a means for isolating several different levels of conductive lines.

One object of the present invention is to provide an improved isolation between two levels of polycrystalline silicon (polysilicon) material.

A more particular object of this invention is to provide improved isolation between the sidewall of a first polysilicon material and a subsequently deposited polysilicon material without unduly increasing the thickness of the gate oxide material under the second polysilicon material.

2. Background Art

It is well known in the prior art to fabricate field effect devices such as charge coupled devices and field effect transistors incorporating the use of several levels of conductors. It has become desireable to use polycrystalline silicon (also referred to as polysilicon) instead of metal for the conductive lines. For proper operation of the resultant field effect devices, it is necessary to insulate the two levels of polysilicon from each other. Particular problems have been occasioned by a failure of the insulator between a sidewall of the first polysilicon layer and the second polysilicon layer. In order to avoid defects, such as pin holes, and to avoid dielectric breakdown, it is known to increase the thickness of the insulator along the sidewall of the first polysilicon layer. By conventional techniques, however, this also increases the thickness of the gate insulator (usually gate oxide). Gate oxide is usually very thin and increasing its thickness has significant adverse affects on the performance of the resultant field effect devices.

BRIEF DESCRIPTION OF DRAWINGS

In the accompanying drawings forming a material part of this disclosure.

DISCLOSURE OF INVENTION

For further comprehension of the invention, and of the objects and advantages thereof, reference will be had to the following description and accompanying drawings, and to the appended claims in which the various novel features of the invention are more particularly set forth.

Figure 1:
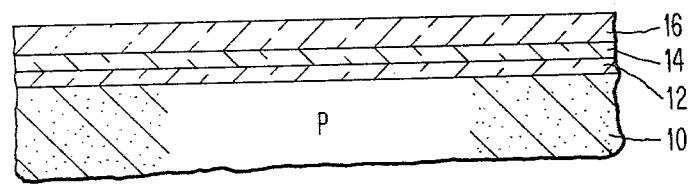
FIG. 1 is a schematic cross section of a semiconductor structure at an early stage in its processing.

Referring now to FIG. 1, there is shown a portion of a semiconductor chip or wafer. A monocrystalline silicon substrate 10 supports the entire structure. Substrate 10 can be doped with either P or N type impurities depending on whether N or P channel field effect devices are desired to be fabricated. The substrate may also have formed therein other doped regions formed by either diffusion or ion implantation for specific applications such as charge coupled devices having buried channels, complementary field effect devices, etc. These details are not shown as they are conventional and well known and our invention is applicable generally regardless of the actual device configurations within the substrate.

The substrate 10 is covered with a layer 12, usually thermal silicon dioxide. Thermal silicon dioxide is formed by exposing the top surface of the silicon 10 to an oxygen containing vapor at an elevated temperature causing the silicon atoms to be converted to silicon dioxide. This thin thermal oxide is then covered by a layer of silicon nitride ($Si_3N_4$). The silicon nitride layer 14 is covered, in turn, by a layer 16 of chemical vapor deposited (CVD) silicon dioxide. Layer 16 could also be deposited by sputtering, pyrolytic deposition, and other techniques in which the silicon dioxide molecules are formed prior to deposition.

Figure 2:
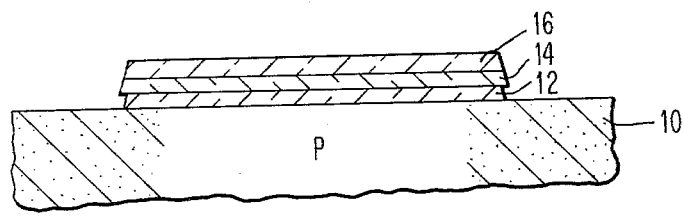
FIG. 2 shows the structure after an etching operation.

The structure of FIG. 1 is then processed by standard photolithographic techniques to produce the structure of FIG. 2. Photoresist forms the mask for the first etching the CVD layer 16. The CVD oxide 16 then masks the etching of nitride 14 down to the thermal oxide layer 12. In an alternative process photoresist is applied directly to the nitride 14 and the nitride is etched by plasma techniques. The structure can then be dip etched removing the exposed portions of layer 12. During the dip etch process, a relatively insignificant portion (e.g. one third) of the layer 16 is also removed.

Figure 3:
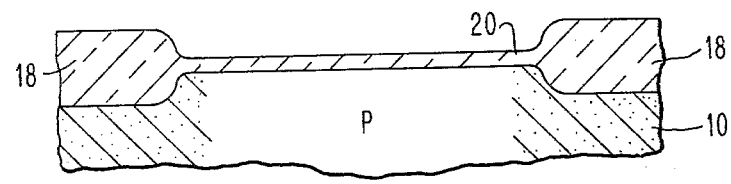
FIG. 3 shows the structure after the formation of dielectric isolation zones.

The structure illustrated in FIG. 2 is then oxidized to form desired oxide isolation zones. It is well known to form oxide isolation zones by a number of techniques. We prefer to oxidize the exposed portions of the substrate surface in FIG. 2 without any prior etching of the substrate. During this oxidation step, oxygen atoms penetrate exposed portions of the top surface of substrate 10 converting the silicon material in situ to silicon dioxide regions 18. This resultant silicon dioxide material penetrates into the substrate 10 and also grows outwardly. At the completion of this oxidation step, the removal of layers 16, 14, and 12, is accomplished by a dip etch down to the top surface of substrate 10. The removal of layer 12 is optional, but when it is removed, then a new gate oxide layer 20 is grown on the exposed surface of substrate 10 resulting in the structure illustrated in FIG. 3. The in situ converted silicon dioxide layer remains a thick field oxide 18.

Figure 4:
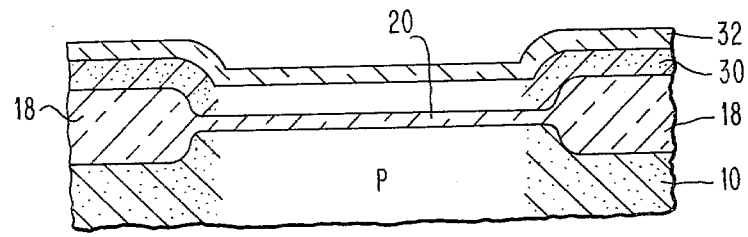
FIG. 4 shows the structure at a further step in the processing.

As shown in FIG. 4, the resultant structure is then covered with a layer of polysilicon material 30 which, in turn, is covered by a layer of CVD oxide 32. Since layer 30 is the first polysilicon layer to be deposited, it is usually referred to as poly I. The distance between the two field oxide zones 18 can be quite large. For example, hundreds of CCD shift register stages may be formed between the two isolation zones 18.

Figure 5:
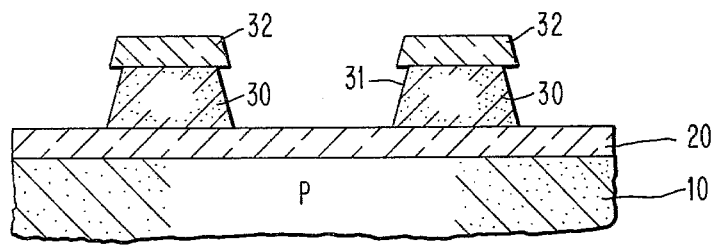
FIG. 5 is an enlarged section of the structure of FIG. 4 after a selective etching step.

In order to more particularly illustrate our present invention, refer to FIG. 5 which shows only a small portion of the section between isolation zones 18. The structure of FIG. 5 is obtained by selectively etching first the CVD oxide layer 32 by use of a photoresist mask. Then, utilizing the CVD oxide 32 as a mask, polysilicon material 30 is also etched down to the gate oxide 20. During the etching of polysilicon 30, a portion of the material under the masking oxide 32 is also etched away resulting in the undercut 31 illustrated in FIG. 5.

This undercut 31 and the requirement to insulate poly I layer 30 from subsequent conductive layers raises the problem that is desired to be overcome by our present invention. One known solution would be to oxidize the sidewalls 31 of layer 30 with a very thick layer. This technique, however, causes exposed portions of the oxide layer 20 to also thicken and since this thickened layer will become the gate oxide for subsequently formed devices, inferior field effect devices result. It is possible to remove the exposed portions of layer 20 in order to ease this excessive gate thickening problem. In practice, however, an oxide layer of sufficient thicknesss to insulate the sidewalls of poly I layer 30 always result in an excessive thickness of gate oxide.

We have solved the aforementioned shortcomings of the prior art by covering the structure of FIG. 5 with a composite insulating layer. We have found that such a composite insulator improves the insulation of the sidewalls of poly I layer 30 without excessively thickening the gate oxide 20.

In accordance with one aspect of our invention, we subject the structure of FIG. 5 to a phosphorous pentoxide ($P_2O_5$) vapor. This forms a layer of phosphosilicate glass (PSG) of controlled thickness and concentration. The most significant effect will be on the exposed sidewalls 31 of polysilicon 30 where a large portion of the silicon will be converted to phosphorous doped silicon dioxide (i.e. PSG). To a lesser degree, a PSG layer is also formed over CVD 32 and gate oxide 20 by phosphorous atoms penetrating the top surface of the pre-existing oxide. A subsequent thermal oxidation step causes oxygen atoms to penetrate the PSG layer completing the composite insulator.

Figure 6:
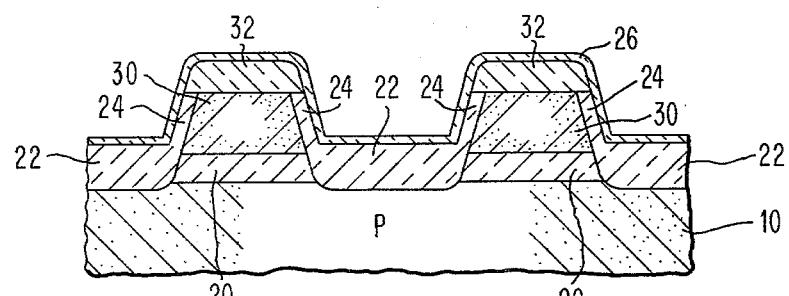
FIG. 6 shows the structure with a composite insulator thereon in accordance with the present invention.

Thus, as illustrated in FIG. 6, the composite insulative coating includes thermal oxide layer 24 covered by PSG layer 26. During the thermal oxidation step, the gate oxide 20 is thickened in regions 22, but to a much lesser degree than would be necessary if sidewall oxide 24 were the only insulation provided on the sidewall of polysilicon layer 30. Since reliance for insulation is placed on the advantageous attributes of the composite layer, the thickness is less than would be required if only a single layer of insulator material were used.

The structure of FIG. 6 can also be obtained by first thermally oxidizing the structure of FIG. 5. A subsequent exposure of the structure to a phosphorous pentoxide vapor produces PSG layer 26. Although the first of the above described sequence of process steps is preferred, the structure of FIG. 6 results regardless of the sequence of process steps.

As a still further alternative, thermal oxide region 24 can be formed by oxidizing the structure of FIG. 5 and followed by a CVD blanket deposition in place of PSG 26. This resultant layer 26 (consisting of CVD rather than PSG) would then form, with layer 24, the desired composite insulator.

Figure 7:
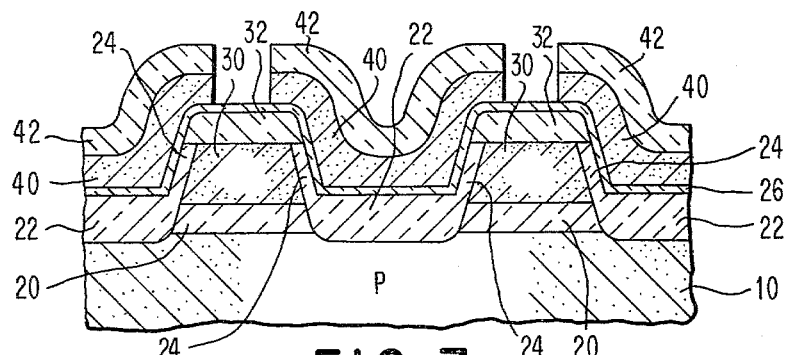
FIG. 7 shows the structure of FIG. 6 at a still further stage in the processing.

At this point in time, the structure of FIG. 6 is ready to accept another conductor layer that will be reliably insulated from the poly I layer 30. Such a conductor may be a second layer of polysilicon material 40 as shown in FIG. 7. It is known to render poly II layer 40 relatively conductive by heavy doping of N type impurities. Poly II layer 40 is then usually covered with another insulating oxide layer 42. Layer 42 forms the insulation between poly II layer 40 and subsequently layers. Since any subsequent layers do not have a direct field effect on the transfer of electrons or holes in the substrate material, layer 42 may be of conventional design.

It is next desirable to isolate portions of the second polysilicon layer 40 from other portions of the polysilicon layer 40. This is conventional in CCD design, for example, where long polysilicon lines 30 and 40 run perpendicular to the plane of the FIG. 7 drawing to control a large number of shift registers propagating charge in parallel. Thus, by standard photolithographic processes, oxide 42 is first removed and then, in turn, used as a mask to remove polysilicon material 40 down to PSG layer 26. This results in the structure illustrated in FIG. 7.

Figure 8:
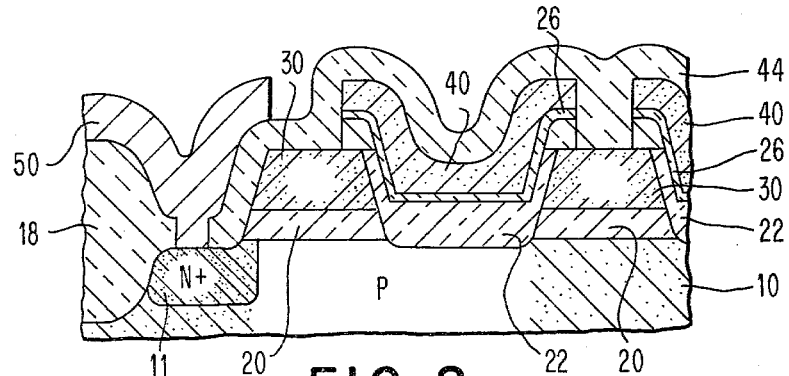
FIG. 8 shows the structure at an even further stage in the processing.

In order to illustrate the formation of the charge launching site, a portion of the shift register adjacent to oxide 18 is shown in FIG. 8. To obtain the structure of FIG. 8, the structure of FIG. 7 is blanket covered with a top passivating layer 44 which can be thermal oxide, chemical vapor deposited oxide or a combination of both. Holes are then selectively etched into this layer 44 and metallic contact is made as by aluminum layer 50 to the N+ diffusion 11. Selective contact to polysilicon layers 30 and 40 are made at the same time near the edge of the shift register structure. The doped N+ region 11 is generally formed by diffusion or ion implantation after the structure of FIG. 7 has been obtained. Directional ion implants for the operation of the CCD as one type of two-phase shift register are also formed at the same time. These directional implants are not shown as they are not germane to the present invention.

Instead of fabricating CCD's as illustrated in FIGS. 5–8, our improved process may be utilized for the fabrication of other types of field effect devices such as field effect transistors. Assume that the spacing between partially recessed oxide regions 118 is sufficient to accommodate one field effect transistor and a capacitor. Such series connected field effect transistors and compacitors are advantageously utilized as one device memory cells in random access memories. FIGS. 9–12 will illustrate such a configuration in which the spacing between partially recessed oxide regions 118 accommodates a one device memory cell. As a first step, CVD layer 132 is selectively etched by known photolithographic processes. The CVD layer 132 is then used as a mask to selectively remove the poly I layer 130. It is then optional whether or not the gate oxide layer 120 is removed, but if removed it must then be regrown. Note the sidewall 131 undercut under CVD layer 132 similar to the undercut in poly I layer 30 under CVD 32 in FIG. 5.

Figure 9:
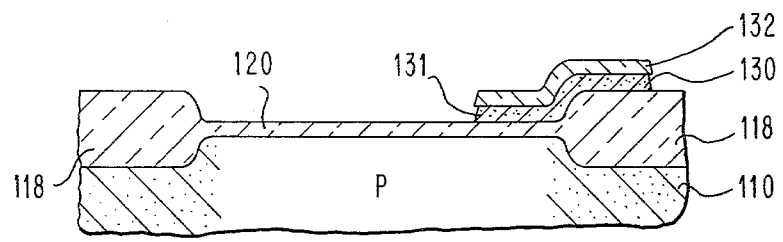
FIGS. 9-12 illustrate the formation of a one device memory cell in accordance with the present invention.
Figure 10:
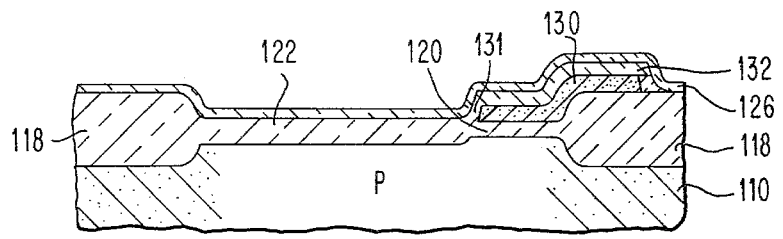

In order to assure that adequate insulation will be provided between sidewall 131 and a subsequent conductive layer, the structure of FIG. 9 is subjected to a phosphorous pentoxide atmosphere. This forms a layer of PSG 126 over the entire structure. As shown in FIG. 10, a subsequent thermal oxidation step penetrates the PSG layer and oxidizes sidewall 131 of poly I layer 130 resulting in thermal oxide region 131'. Also, during the same thermal oxidation step, the exposed gate oxide region portion 122 is thickened while the protected portion gate oxide 120 remains unchanged in thickness. The thickness of the gate oxide portion 122 becomes approximately twice the thickness of the original gate oxide layer 120.

Figure 11:
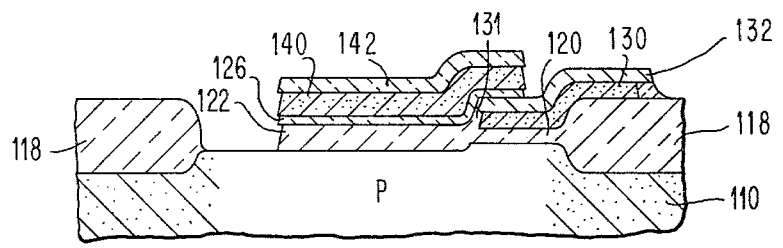
Figure 12:
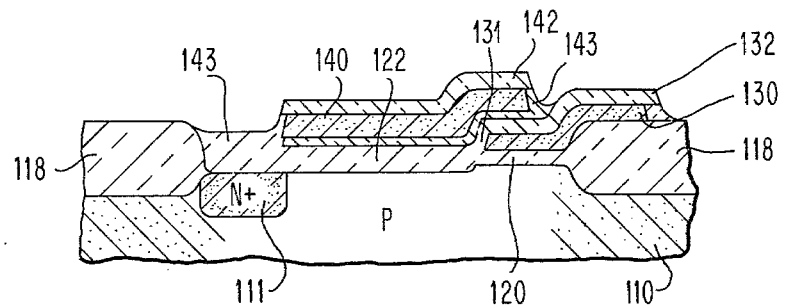

A second layer of polysilicon 140 and a CVD layer 142 are then applied and selectively etched to arrive at the structure of FIG. 11. Source and drain diffusions or implants such as N+ doped region 111 are then formed into the substrate 110 and the entire structure is reoxidized forming silicon dioxide layer 143, as shown in FIG. 12. Contact holes (not shown) are then selectively etched to form metallic contact to doped regions such as N+ region 111 and to the polysilicon layers 130 and 140.

When the structure of FIG. 12 is used as a one device memory cell, a constant bias is usually applied to the poly I layer 130. A positive bias potential causes the accumulation of N type carriers (electrons) in the otherwise P type material under the gate oxide region 120. This not only forms a capacitance but also the source region of the field effect transistor. The channel region of the field effect transistor is under the gate oxide 122 while the drain region is doped region 111. The FET is turned on and off by the selective application of potentials to the gate (which is part of the poly II conductor 140) and to the drain by means of a metallic contact (not shown) to drain region 111.

BEST MODE FOR CARRYING OUT THE INVENTION

As seen by reference to the various drawing figures, our invention provides improved insulation between several levels of conductors. More particularly, the sidewall region 31 of poly I layer 30 in FIG. 5 must be reliably insulated from a subsequently deposited poly II layer. The identical problem is presented by sidewall 131 of poly I layer 130 in the FIG. 9 embodiment. Our invention involves the formation of a composite insulating layer, particularly over the just described sidewall portions of the poly I layer. Such a composite layer has the effect of sealing pin holes in the first of the two layers making up the composite layer during the formation of the second of the two layers. A further advantage of the composite layer is that the interface between the two layers forms traps preventing the transfer of electrons. The overall effect of the composite insulating layer is an improvement in dielectric integrity by substantially reducing field breakdowns as well as leakage current. In order to form the desired composite insulator, three alternate processes have been described.

A first method subjects the FIG. 5 embodiment to a phosphorous pentoxide ($P_2O_5$) atmosphere for a period of approximately 8 to 15 minutes at a temperature of approximately 800° C. to 870° C. The phosphorous pentoxide atmosphere is typically derived from a $POCl_3$ source. This results in the formation of phosphosilicate glass (PSG) that is approximately 200 Å thick over the sidewall 31. Exposed portions of gate oxide 20 and CVD oxide 32 will receive thinner layers of PSG caused by phosphorous atoms penetrating the exposed oxide surfaces. It is noted that at this point in time all monocrystalline silicon surfaces are masked to prevent undesired N type diffusion. The resultant PSG covered structure is reoxidized at approximately 970° C. to 1,050° C. in a dry oxygen atmosphere for a period of approximately 15 to 40 minutes. This causes oxygen atoms to penetrate the PSG layer and convert the sidewall material 31 of the poly I layer 30 to silicon dioxide "in situ." This in situ converted oxide 24 may be of sufficient thickness to fill the undercut region resulting in the structure of FIG. 6. Some of the oxygen atoms penetrate the PSG layer covering gate oxide 20 and also penetrate gate oxide 20 resulting in a slightly thickened gate oxide 22. There is a relationship between the thickness of oxide 24 and gate oxide 22 in the sense that each will be thicker if the temperature and time of reoxidation are increased. Oxide 24, however, will grow much faster than the thickening of gate oxide region 22 because the poly I region is more accessible to the oxygen atoms than the substrate under the gate oxide. Because of the improved insulating properties of the composite insulator formed by oxide 24 and PSG layer 26, the thermal reoxidation step can be minimized, thereby minimizing the thickening of the gate oxide 22.

The second described process, in accordance with our invention, reverses the steps of PSG formation and reoxidation. Thus, as a first step, the FIG. 5 structure is oxidized in the same manner previously specified. During this step, not only is the sidewall 31 oxidized but the gate oxide 20 is slightly thickened at exposed portions. The PSG layer is then formed second by the previously described procedure. This PSG layer will be substantially uniform in thickness as the phosphorous atoms will penetrate into the top surface of all of the oxide as illustrated in FIG. 6. The resultant composite insulator will consist of in situ converted silicon dioxide region 24 covered by PSG layer 26, a structure identical to that obtained by the first described series of process steps.

As a third alternative, the composite insulator is formed by a layer of thermal oxide followed by a layer of chemical vapor deposited oxide. With reference to FIG. 6, for example, a thermal oxide layer 24 having a thickness in the order of 250 Å is grown. This is followed by a layer 26 formed by CVD oxide in the order of 500 to 750 Å. The drawing, of course, is not to scale as is the usual practice in the illustration of semiconductor structures. In this third alternative, when layer 26 is considered to be formed by chemical vapor deposited oxide, it will be thicker than thermally oxidized region 24.

The aforementioned three alternative processes described with respect to FIG. 5 and FIG. 6 are equally applicable to the embodiment of FIG. 9 and FIG. 10. The polysilicon layer 130 has its critical sidewall 131 oxidized in situ forming silicon dioxide 131′. With the first two processes, the structure of FIG. 10 ends up with a layer 126 consisting of PSG. In the third alternative process, the layer 126 is CVD.

While we have illustrated and described the preferred embodiments of our invention, it is to be understood that we do not limit ourselves to the precise construction herein disclosed and the right is reserved to all changes and modifications coming within the scope of the invention as defined in the appended claims.

Having thus described our invention, what we claim as new, and desire to secure by Letters Patent is:

1. A method for forming insulated polycrystalline silicon conductors for field effect devices comprising:
   forming a silicon dioxide gate insulating layer on a silicon substrate;
   forming a first polycrystalline silicon electrode over a portion of said gate insulating layer;
   forming a composite insulating layer over said first polycrystalline silicon electrode particularly at vertical surfaces thereof while simultaneously forming a composite gate insulating layer; and forming a second polycrystalline silicon electrode over said composite gate insulating layer and at least a portion of said composite insulating layer.

2. A method as in claim 1 wherein the step of forming said composite insulating layer comprises:

exposing the structure to a vapor containing both phosphorous and oxygen atoms thereby forming a layer of phosphosilicate glass; and exposing the resultant structure to a vapor containing oxygen atoms, said oxygen atoms penetrating through said phosphosilicate glass thereby oxidizing at least a portion of said polycrystalline silicon electrode in situ forming a layer of silicon dioxide material between said phosphosilicate glass and said polycrystalline silicon.

3. A method as in claim 1 where the step of forming said composite insulating layer comprises:

exposing the structure to a vapor containing oxygen atoms, thereby oxidizing at least a portion of said polycrysalline silicon in situ forming silicon dioxide; and exposing the structure to a vapor containing phosphorous and oxygen atoms thereby forming phosphosilicate glass over said in situ converted silicon dioxide.

4. A method as in claim 1 wherein the step of forming said composite insulating layer comprises:

exposing the structure to a vapor containing oxygen atoms, thereby oxidizing at least a portion of said polycrystalline silicon in situ forming silicon dioxide; and depositing a layer of chemical vapor deposited silicon dioxide over the in situ converted silicon dioxide layer, thereby forming a composite insulating layer.

5. A method as in claims 2 or 3 wherein said vapor containing phosphorous and oxygen atoms is applied at an elevated temperature of approximately 800° C. to 870° C.

6. A method as in claim 2, 3 or 4 wherein in the step of exposing the structure to an atmosphere containing oxygen atoms takes place at an elevated temperature of approximately 970° C. to 1,050° C. for a time of approximately 15 minutes to 40 minutes.

7. A method for forming insulated conductors for field effect devices comprising:

forming a silicon dioxide gate insulating layer on a silicon substrate;

forming a first polycrystalline silicon electrode over a portion of said gate insulating layer;

forming a composite insulating layer over said first polysilicon electrode particularly at vertical surfaces thereof while simultaneously forming a composite gate insulating layer;

forming a second electrode over said composite gate insulating layer and at least a portion of said composite insulating layer;

forming an opening to said silicon substrate;

introducing impurities through said opening into said substrate, thereby forming a doped region; and forming a metallic contact to at least a portion of said doped region.

* * * * *